(12) United States Patent
Yamashita et al.

(10) Patent No.: US 7,034,568 B2
(45) Date of Patent: Apr. 25, 2006

(54) LOGIC CIRCUIT

(75) Inventors: Hiroki Yamashita, Hachioji (JP); Akio Koyama, Oume (JP); Tatsuhiro Aida, Hino (JP); Atsushi Itoh, Fussa (JP); Masahito Sonehara, Koganei (JP)

(73) Assignee: Hitachi, Ltd., Tokyo (JP)

( * ) Notice: Subject to any disclaimer, the term of this patent is extended or adjusted under 35 U.S.C. 154(b) by 60 days.

(21) Appl. No.: 10/886,035

(22) Filed: Jul. 8, 2004

(65) Prior Publication Data
US 2005/0068066 A1 Mar. 31, 2005

(30) Foreign Application Priority Data
Sep. 25, 2003 (JP) ............... 2003-334368

(51) Int. Cl.
*H03K 17/16* (2006.01)
(52) U.S. Cl. .................... 326/33; 326/31; 326/115
(58) Field of Classification Search ............ 326/26, 326/27, 31–34, 82, 83, 112, 119, 121, 85, 326/127
See application file for complete search history.

(56) References Cited
U.S. PATENT DOCUMENTS 5,225,720 A * 7/1993 Kondoh et al. ............ 326/50
5,471,131 A * 11/1995 King et al. ................ 323/314
6,127,854 A * 10/2000 Illegems .................... 327/66
6,127,868 A * 10/2000 Phillips ..................... 327/205
6,239,616 B1 * 5/2001 Churcher et al. ........... 326/49

FOREIGN PATENT DOCUMENTS
JP 2001-267859 3/2000

* cited by examiner

*Primary Examiner*—Don Le
(74) *Attorney, Agent, or Firm*—Reed Smith LLP; Stanley P. Fisher, Esq.; Juan Carlos A. Marquez, Esq.

(57) ABSTRACT

The power supply-voltage dependency of a current source current is reduced and the power supply voltage is lowered. The invention includes an emitter-coupled logic circuit 118 and a reference-voltage generating circuit 119 for generating a reference voltage VCSC for controlling a drain current (=current source current ICS) of a constant current-supplying n-type MOS transistor 110. The emitter-coupled logic circuit 118 comprises a current switch made up of a pair of emitter-coupled bipolar transistors 106 and 107, a constant current-supplying n-type MOS transistor 110 that is connected in series with the current switch, and resistor means 108 and 109 connected in series with the bipolar transistors 106 and 107 individually for obtaining an output voltage. The reference-voltage generating circuit 119 comprises an n-type MOS transistor 111, a bipolar transistor 112 which determines the drain voltage of the n-type MOS transistor 111, and a control circuit 120 for controlling the drain current of the n-type MOS transistor 111.

13 Claims, 7 Drawing Sheets

LOGIC CIRCUIT

CLAIM OF PRIORITY

The present application claims priority from Japanese application JP 2003-334368 filed on Sep. 25, 2003, the content of which is hereby incorporated by reference into this application.

BACKGROUND OF THE INVENTION

1. Field of the Invention

The present invention relates to a voltage regulating technique for logic circuits including a current switch. Particularly, the invention relates to a voltage lowering technique for bipolar transistor/MOS transistor-mixed logic circuits based on a BiCMOS process.

2. Background Art

Recent years have seen a significant increase in the processing speed of information processing equipment due to the improvements in semiconductor devices made possible by decreasing design rules. In particular, there has been a significant increase in the communication speed of information transmission based on the Internet-related optical communication networks, for example. In ICs for ultra high-speed communications, bipolar transistors and MOS transistors are mixed to meet the demand for higher speeds and lower power consumption.

An example of a BiCMOS logic circuit in which higher speeds are required is an emitter-coupled logic circuit in which a bipolar transistor is used in a current switch portion and an n-type MOS transistor is used in a constant current source. FIG. 12 shows an example of a basic circuit configuration of such a BiCMOS logic circuit. In FIG. 12, numeral 1001 designates an emitter-coupled logic circuit, and numeral 1002 designates a reference voltage generating circuit. The emitter-coupled logic circuit 1001 is made up of a current switch consisting of a pair of bipolar transistors 1011 and 1012, an n-type MOS transistor 1014 for constant current supply, and resistor means 1005 and 1006 for obtaining an output voltage.

The reference voltage generating circuit 1002 is made up of a constant current source 1017 and an n-type MOS transistor 1016 that mirrors the current flowing in the constant current source 1017 with the current flowing in the constant-current supplying n-type MOS transistor 1014. The operation of this circuit is briefly described in the following. Complementary signals are applied to input terminals 1007 and 1008. For example, when the input 1007 is at a high level and the input 1008 is at a low level, the bipolar transistor 1011 is turned on and the bipolar transistor 1012 is turned off. Thus, a current ICS flowing in the MOS transistor 1014 flows along a path consisting of the power supply 1003, resistor means 1005, and bipolar transistor 1011. As a result, an output 1009 occurs at a low level due to a voltage Va dropped by the resistor means 1005 and current ICS, while an output 1010 increases to a voltage VDD of the power supply 1003.

The product of the resistor means 1005 and the current ICS constitutes an output amplitude Va. Since the input and output signal levels are equal, a high-level input becomes VDD and a low-level input becomes VDD−Va. Since a current mirror circuit is formed by the n-type MOS transistor 1014 and n-type MOS transistor 1016, namely, their gates share a common reference voltage, the current source current ICS that flows in the n-type MOS transistor 1014 is substantially the same as the current flowing in the n-type MOS transistor 1016 (see Patent Document 1, for example).

(Patent Document 1)
JP Patent Publication (Kokai) No. 2001-267859 A

SUMMARY OF THE INVENTION

In the above-described BiNMOS circuit, a drain voltage VDS of the n-type MOS transistor 1014 is determined by the base potential of the bipolar transistor that is turned on by the current switch. Specifically, the drain voltage VDS is equal to the potential of the high-level input from which the forward junction voltage of the Si bipolar transistor, i.e., approximately 0.8 V, is subtracted. Since the high-level input is equal to the power supply voltage VDD, the drain voltage VDS of the n-type MOS transistor 1014 is VDD−0.8 V. Thus, the drain voltage VDS of the n-type MOS transistor 1014 is dependent on the power supply voltage VDD. On the other hand, the drain current of the n-type MOS transistor 1016 in the reference voltage generating circuit 1002 is not dependent on the power supply voltage VDD, nor are the gate and drain voltages of the n-type MOS transistor 1016 dependent on the power supply voltage VDD.

The drain current IDS of the n-type MOS transistor 1014 is dependent on the drain voltage VDS, as shown in FIG. 13. When the drain voltage VDS drops below a certain voltage of approximately 0.6 V (=VDD−0.8 V), the drain current significantly drops (enters from region A into region B). Thus, as the power supply voltage VDD drops below 1.4 V, the drain current, namely the current source current ICS, significantly drops. As a result, the output amplitude Va significantly drops, thereby increasing the likelihood of a circuit malfunction.

As described above, the prior art has been problematic in that: (1) the power supply voltage VDD is dependent on the current source current; and (2) the power supply voltage cannot be reduced below approximately 1.4 V.

In view of the foregoing, it is the object of the present invention to provide a logic circuit capable of low-voltage operation in which, in response to above (1), the power supply voltage VDD dependency of the current source current and output amplitude is reduced and, in response to above (2), which can be operated when the power supply voltage is reduced to less than 1.4 V.

In order to achieve the aforementioned object, in accordance with the invention, a reference-voltage generating circuit is provided with means for making the drain voltage of a constant current-supplying n-type MOS transistor in an emitter-coupled logic circuit equal to the drain voltage of an n-type MOS transistor in the reference-voltage generating circuit, and means for controlling the gate voltage such that the drain current in said constant current-supplying n-type MOS transistor is maintained at a constant level when the power supply voltage VDD fluctuates.

The individual features recited in the appended claims are independent from each other and, therefore, they may be deleted or additional features may be incorporated as required. It should be obvious that such deletions or additions are also incorporated in the scope of the present invention.

By employing the logic circuit of the invention, the following advantages can be obtained:

(1) The drain current of the constant current-supplying n-type MOS transistor, namely the current source current, does not depend on the power supply voltage VDD, nor does the output amplitude depend on VDD.

(2) The power supply voltage VDD in the logic circuit can be lowered as compared with the conventional circuits.

DESCRIPTION OF THE PREFERRED EMBODIMENTS

In the present specification, the term "current switch" or "current switch circuit" generally refers to an emitter-coupled circuit in which the emitters of two bipolar transistors are coupled, or a source-coupled circuit in which the sources of two MOS FETs are coupled. The term "control terminal" refers to a terminal for controlling the output of a transistor, and it corresponds to the gate terminal of a MOS transistor or the base terminal of a bipolar transistor. A "current terminal" is a terminal for allowing a current to flow between the input and output; it corresponds to the source/drain terminals of a MOS transistor and to the emitter/collector terminals of a bipolar transistor.

Figure 1:
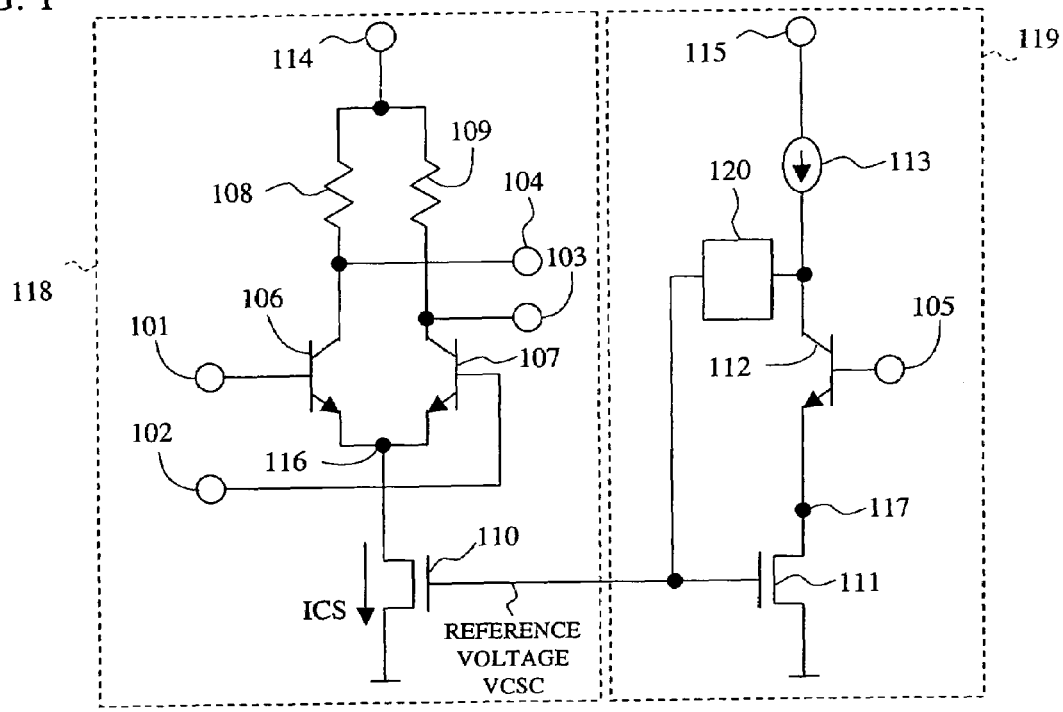
FIG. 1 shows a circuit diagram of an example of a BiNMOS fundamental circuit according to a first embodiment of the invention.

In the following, embodiments of the invention will be described with reference to the drawings. FIG. 1 shows an example of the configuration of a BiCMOS circuit according to a first embodiment of the invention. As shown in FIG. 1, the BiCMOS logic circuit of the present embodiment includes an emitter-coupled logic circuit 118 for realizing logic functions and a reference voltage generating circuit 119 for generating a reference voltage VCSC with which to control the drain current (=current source current ICS) of a constant current-supplying n-type MOS transistor 110, which will be described later.

The emitter-coupled logic circuit 118 includes a current switch consisting of a pair of emitter-coupled bipolar transistors 106 and 107, a constant current supply n-type MOS transistor 110 connected in series with the current switch, and resistor means 108 and 109 that are connected in series with each of the bipolar transistors 106 and 107 for obtaining an output voltage.

On the other hand, the reference voltage generating circuit 119 includes an n-type MOS transistor 111, a bipolar transistor 112 that determines the drain voltage of the n-type MOS transistor 111, a constant current source 113 connected in series with the n-type MOS transistor 111 and bipolar transistor 112, and a control circuit 120 for controlling the drain current of the n-type MOS transistor 111.

The operation of the logic circuit is described with reference to FIG. 1. Complementary signals are applied to the input terminals 101 and 102, which are connected to the bases of the pair of bipolar transistors 106 and 107, respectively. For example, when a high level is applied to the input terminal 101, a low level is applied to the input terminal 102. In this case, the bipolar transistor 106 in the current switch portion of the emitter-coupled logic circuit 118 is turned on while the bipolar transistor 107 is turned off. As a result, the current ICS that flows through the constant current-supplying n-type MOS transistor 110 flows along a path consisting of the power supply 114, resistor means 108, and bipolar transistor 106. Thus, the output 104 assumes a low level (=VDD−Va) due to the voltage Va dropped by the resistor means 108 and current ICS, while the output 103 is raised by the resistor means 109 and increases to the voltage VDD of the power supply 114. The product of the resistor means 108 and current ICS is exhibited as the output amplitude Va.

Since the input and output signal levels are equal, the high-level input is VDD and the low-level input is VDD−Va. The potential at a common node 116 in the current switch portion of the emitter-coupled logic circuit 118, namely the drain voltage of the n-type MOS transistor, is the base potential of the bipolar transistor 106, which is turned on, minus the forward junction voltage, or approximately 0.8 V. Thus, the potential at the node 116, or the drain voltage of the n-type MOS 110, is the high-level input (=VDD) minus 0.8 V.

On the other hand, the drain voltage of the n-type MOS transistor 111 in the reference voltage generating circuit 119 is the base potential of the bipolar transistor 112 minus approximately 0.8 V. Therefore, by setting the base potential of the transistor 112 to be equal to the high-level input of the emitter-coupled logic circuit (=VDD), the drain voltages of the two n-type MOS transistors 110 and 111 can be set to the same value. Further, as the gates of the n-type MOS transistors 110 and 111 are connected, an identical current flows. It should be noted, however, that the foregoing can be realized provided that the gate widths of the two n-type MOS transistors 110 and 111 are set to be the same value. If their gate widths are set to be different values, the current would be substantially proportional to the gate width.

The control circuit 120 controls the gate voltage VCSC such that the current from the constant current source 113 flows via the bipolar transistor 112 to the n-type MOS transistor 111. Thus, the current flowing in the constant current source 113 is equal to the current that flows in the n-type MOS transistors 111 and 110. Thus, by setting the voltage at a voltage setting terminal 105 to be equal to the high-level input to the emitter-coupled logic circuit at all times, the current ICS in the constant current-supplying n-type MOS transistor 110 can be set to constitute the current in the constant current source 113 without depending on the power supply voltage VDD of the power supply 114.

In accordance with the logic circuit of the present embodiment, the power supply voltage VDD dependency of the current source current ICS and the output amplitude can be reduced, so that the circuit can be operated at a lower voltage than conventional circuits.

Figure 2:
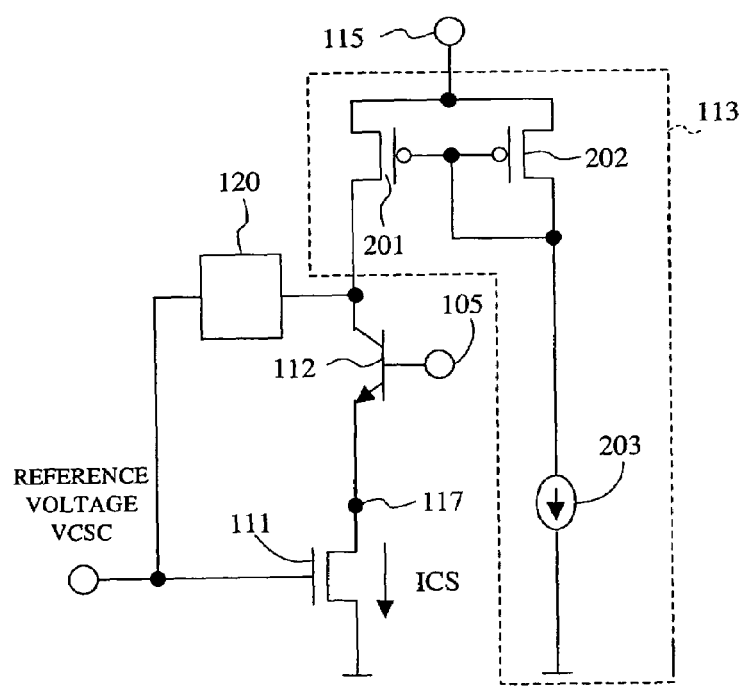
FIG. 2 shows a circuit diagram of an example of a reference-voltage generating circuit in a logic circuit according to a second embodiment of the invention.

FIG. 2 shows an example of the configuration of a reference voltage generating circuit according to a second embodiment of the invention. In this example, the constant current source 113 (FIG. 1) is made up of a current mirror circuit consisting of p-type MOS transistors 201 and 202, and a constant current source 203. In order to permit the p-type MOS transistors 201 and 202 to have substantially the same drain current, the voltage of the power supply 115 is set separately from the power supply 114 of the emitter-coupled logic circuit 118 so as to allow a sufficiently high voltage (1 V or higher) to be applied between the source and drain of the p-type MOS transistors 201 and 202. Further, by employing the configuration shown in FIG. 2, the power supply voltage VDD dependency of the power supply 114 regarding the current of the n-type MOS transistor 111 can be reduced. Namely, by lowering the power supply voltage VDD, the source-drain voltage VDS of the n-type MOS transistor is reduced. At the same time, the current ICS that flows in the transistor 111 is also reduced. As a result, the source-drain voltage of the p-type MOS FET 201 is reduced, resulting in an increase in the collector potential of the transistor 112. In response, the control circuit 120 increases the voltage (VCSC) applied to the gates of the constant current-supplying n-type MOS transistor 110 and the n-type MOS transistor 111, thereby increasing the drain current ICS. Thus, feedback is provided such that the drain current would not decrease in response to the decrease in the power supply voltage VDD. If the power supply voltage VDD increases and the voltage applied to the gates of the constant current-supplying n-type MOS transistor 110 and the n-type MOS transistor 111 increases beyond a certain voltage level, the source-drain voltage VDS of the n-type MOS transistor 111 increases excessively, resulting in an increase in the drain current of the transistor 111. As a result, the source-drain voltage of the p-type MOSFET 201 increases, and the collector potential of the transistor 112 drops. In response, the control circuit 120 is operated to reduce the voltage (VCSC) applied to the gates of the constant current-supplying n-type MOS transistor 110 and the n-type MOS transistor 111, thereby decreasing the drain current ICS.

Figure 3:
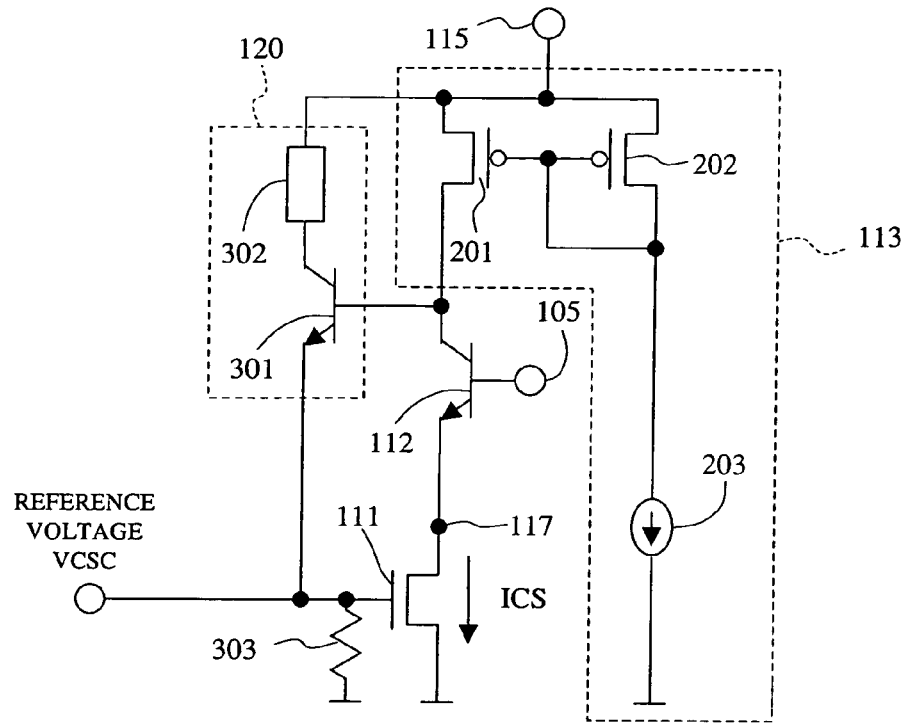
FIG. 3 shows a circuit diagram of another example of the reference-voltage generating circuit in a logic circuit according to a third embodiment of the invention.

FIG. 3 shows a circuit diagram of an example of a reference voltage generating circuit adopted in a logic circuit according to a third embodiment of the invention. In this embodiment, a first control circuit 120 comprises a bipolar transistor 301 of which the collector is connected via a resistor means 302 to a power supply 115, the base is connected to the collector of the bipolar transistor 112 for biasing the drain voltage of the n-type MOS transistor 111, and the emitter is connected to the reference voltage terminal VCSC and, via the resistor means 303, to the ground, for example.

The first control circuit 120 operates such that if the voltage at the voltage setting terminal 105 is varied, the same current flows in the n-type MOS transistor 111 as that which flows in the constant current source 203. For example, if the potential at the voltage setting terminal 105 drops, the drain voltage of the n-type MOS transistor 111 also drops, such that the drain current of the n-type MOS transistor 111 becomes decreased. As a result, the current in the p-type MOS transistor 201 decreases, and its drain voltage also decreases. This causes the base potential of the bipolar transistor 301 to increase, resulting in an increase in its emitter potential and reference voltage VCSC. Consequently, the drain current of the n-type MOS transistor 111 increases.

Namely, as the voltage of the voltage setting terminal 105 drops and the drain current of the n-type MOS transistor 111 tends to decrease, the gate voltage increases to prevent the decrease in the drain current. Thus, regardless of the potential at the voltage setting terminal 105, the drain current of the n-type MOS transistor 111 is maintained at a constant level.

Thus, even when the drain voltage VDS of the constant-current n-type MOS transistor 110 varies as a result of a variation of the power supply voltage VDD of the power supply 114 in the emitter-coupled logic circuit, the gate voltage, namely, the reference voltage VCSC, varies such that the drain current in the n-type MOS transistors 111 and 110 does not change. In other words, a variation of the power supply voltage VDD is not translated into a variation in the output voltage amplitude Va. In particular, the drain current does not vary even when the drain voltage VDS of the n-type MOS transistors 110 and 111 is decreased to several dozen millivolts. Accordingly, in the logic circuit of the present embodiment, the power supply voltage VDD can be reduced +0.8 V, which is a lower limit value of VDS of the n-type MOS transistors 111 and 110, as mentioned above. Thus, in the BiCMOS current-mode logic circuit, the power supply voltage VDD can be decreased to approximately 0.9 V.

Figure 4:
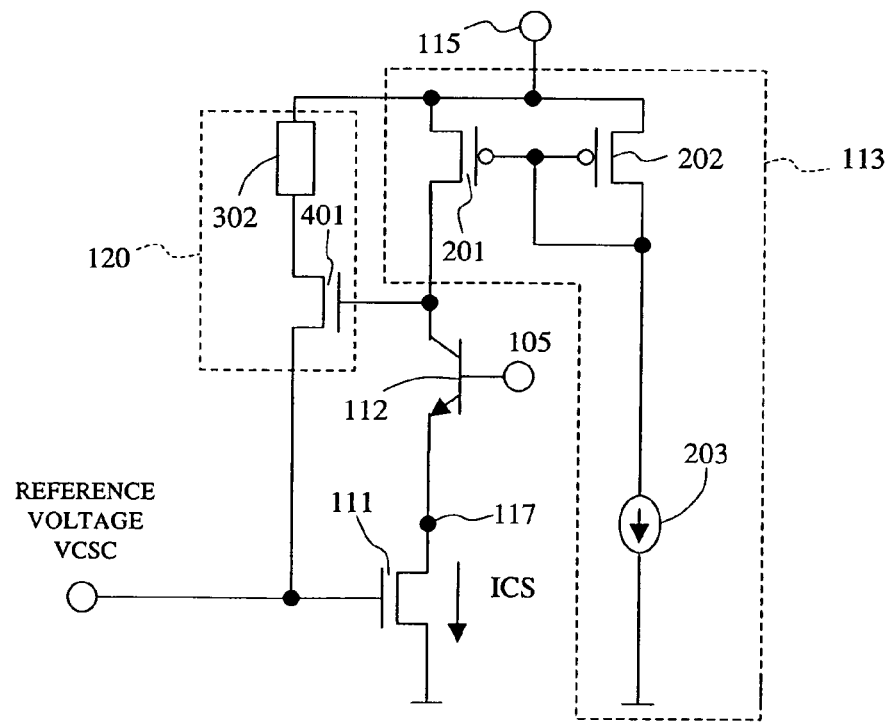
FIG. 4 shows a circuit diagram of another example of the reference-voltage generating circuit in a logic circuit according to a fourth embodiment of the invention.

FIG. 4 shows an example of a reference voltage generating circuit adopted in a logic circuit according to a fourth embodiment of the invention. As shown in FIG. 4, a first control circuit 120, which is shown encircled by a broken line within a reference voltage generating circuit 113 of the present embodiment, includes a resistor means 302 and an n-type MOS transistor 401. The n-type MOS transistor 401 has its drain connected to a power supply 115 via the resistor means 302, its gate connected to the collector of a bipolar transistor 112 for biasing the drain voltage of an n-type MOS transistor 111, and its source connected to a reference voltage terminal VCSC.

As the reference voltage generating circuit shown in FIG. 4 is operated in the same manner as that according to the third embodiment, the drain current that flows in the n-type MOS transistor 111 is not dependent on the potential at the voltage setting terminal 105. Thus, when combined with the emitter-coupled logic circuit 118 (FIG. 1), the drain current in the constant current-supplying n-type MOS transistor 110 (FIG. 1) does not easily fluctuate, even when the power supply voltage VDD of the power supply 114 fluctuates, thereby enabling low voltage operation.

Figure 5:
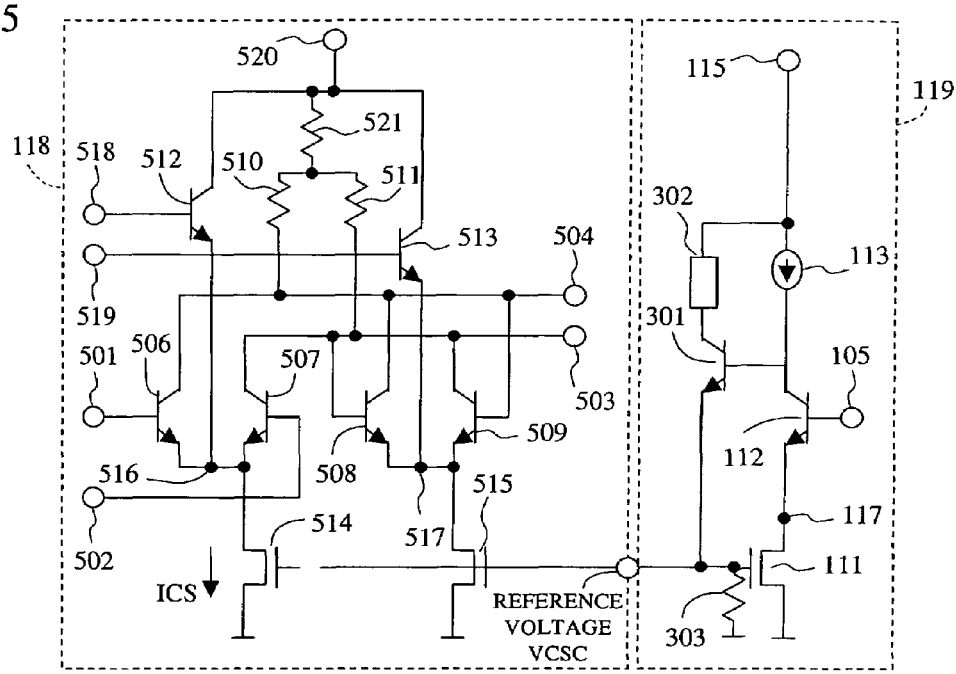
FIG. 5 shows a circuit diagram of a logic circuit according to a fifth embodiment of the invention, illustrating an example of a flip-flop circuit.

With reference to FIG. 5, a logic circuit according to a fifth embodiment of the invention will be described.

FIG. 5 shows the logic circuit of the fifth embodiment, which is an example of a flip-flop circuit. As shown in FIG.

5, the flip-flop circuit of the present embodiment includes a logic circuit portion 118 and a reference voltage generating circuit 119. The logic circuit portion 118 includes a resistor means 521 for shifting the output level, load resistors 510 and 511 for obtaining output, bipolar transistors 506 and 507 that operate when acquiring data, bipolar transistors 508 and 509 that operate when storing data, bipolar transistors 512 and 513 for switching between data capturing and data storage functions, and constant current-supplying n-type MOS transistors 514 and 515.

By applying to the voltage setting terminal 105 of the reference-voltage generating circuit 119 a voltage equal to the high-level Vih1 which is applied to the data input 501 or 502, current fluctuation in the constant current-supplying n-type MOS transistors 514 and 515 and MOS transistor 111 due to power supply fluctuations can be prevented in the same manner as in the logic circuit of the first embodiment shown in FIG. 1.

In the above circuit, when acquiring data, for example, VDD−Va is applied to the data input 501 as high-level Vih1, VDD−2Va is applied to the input 502 as low-level Vil1, VDD is applied to a clock input 519 as high-level Vih2, and a voltage that is set in VDD−2Va is applied to a clock input 518 as low-level Vil2. Va is the data input/output amplitude and is the product of Ics and the load resistor 510 or 511. An input amplitude Va2 at the clock input 518 or 519 is set to be twice the data input/output amplitude Va. In this case, the clock input 519 becomes high-level Vih2 and the clock input 518 becomes low-level Vil2. Accordingly, the bipolar transistor 513 is turned on while the bipolar transistor 512 is turned off, and the bipolar transistor 506 is turned on while the bipolar transistor 507 is turned off, depending on the inputs 501 and 502.

As a result, the current Ics in the constant current-supplying n-type MOS transistor 514 flows via the power supply 520, high-level shifting resistor means 521, resistor means 510, bipolar transistor 506, and constant current-supplying n-type MOS transistor 514 in that order. As a result, the output 504 becomes a low-level Vol (=VDD−2 Va) due to the voltages dropped across the high-level shifting resistor means 521 and the load resistor 510, while the output 503 increases to the potential of the high-level shift node (=VDD−Va), so that high-level Voh becomes VDD−Va.

By setting the high-level Vih2 at the clock input 518 or 519 to be higher than the high-level Vih1 at the data input 501 or 502, the current in the constant current-supplying n-type MOS transistor 515 flows via the power supply 520, bipolar transistor 513, and constant current-supplying n-type MOS transistor 515 in that order. Therefore, the bipolar transistors 508 and 509 turn off irrespective of the outputs 504 and 503.

On the other hand, when storing data, the clock input 518 becomes high-level Vih2 and the clock input 519 becomes low-level Vil2, whereby the bipolar transistor 513 is turned off and the bipolar transistor 512 is turned on, and the bipolar transistor 508 or 509 is turned on depending on the outputs 504 and 503 irrespective of the inputs 501 and 502. For example, when the output 503 is high-level Vih1 and the output 504 is low level, the bipolar transistor 508 is turned on and the bipolar transistor 509 is turned off, such that the current Ics in the n-type MOS transistor 515 flows form the power supply 520, the high-level shifting resistor means 521, load resistor 510, bipolar transistor 508, and n-type MOS transistor 515 in that order.

As a result, the output 504 retains the low-level Vol (=VDD−2Va) due to the voltages dropped by the resistor means 521 and load resistor 510, while the output 503 maintains the high level Voh (=VDD−Va). Further, because the current in the n-type MOS transistor 514 flows via the power supply 520, bipolar transistor 512, and n-type MOS transistor 514 in that order, the bipolar transistors 506 and 507 are turned off regardless of the data inputs 501 and 502. In the following, the potentials at individual nodes are identified and the lower voltage limit is determined in the case of data capture (clock input 519 is high-level Vih2, clock input 518 is low-level Vil2) when the input 501 is high-level Vih1 and the input 502 is low-level Vil1.

The potentials at the data inputs 501 and 502 are as follows:

$Vih1 = VDD - Va$ $Vil1 = VDD - 2Va$

The potentials at the clock inputs 518 and 519 are as follows:

$Vih2 = VDD$ $Vil2 = VDD - 2Va$

The potential Vc2 at 516, namely, the drain-source voltage Vds1 of the n-type MOS transistor 514, is as follows. Incidentally, in order for the current switching transistors 506 and 507 to be switched, the data input/output amplitude Va must be approximately 0.2 V.

$$Vc2 = Vds1$$
$$= Vih1 - 0.8 \text{ V}$$
$$= VDD - Va - 0.8 \text{ V}$$
$$= VDD - 1 \text{ V}$$

Figure 13:
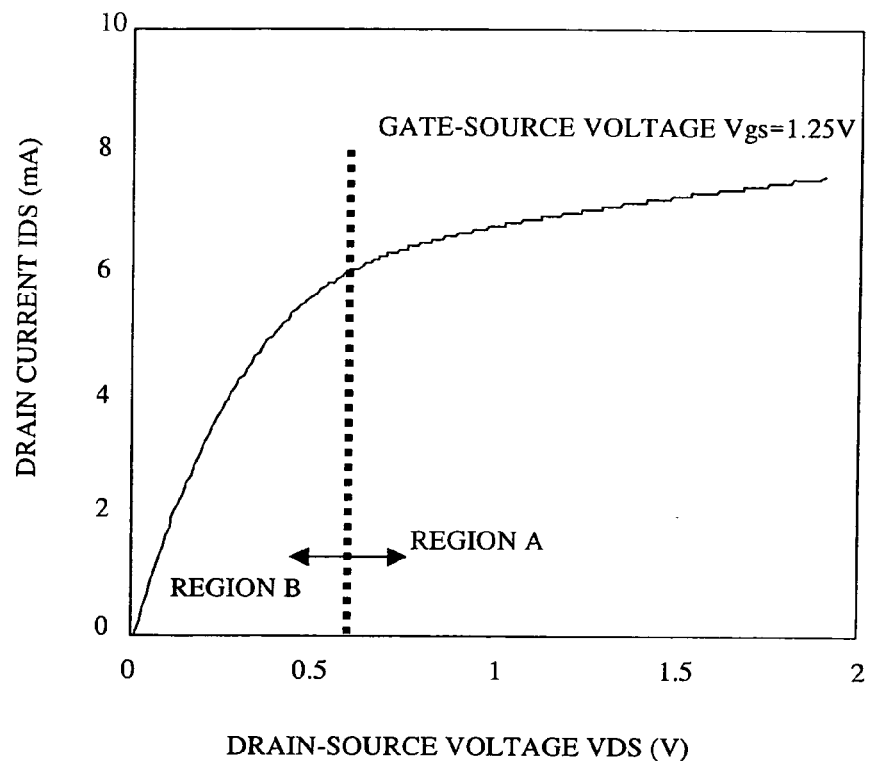
FIG. 13 shows an example of the drain-voltage dependency of the drain current of a constant current-supplying n-type MOS transistor in a conventional emitter-coupled logic circuit.

Thus, in order to prevent the current fluctuation in the n-type MOS transistor 514, Vds1 must be set to be not less than 0.7 V in view of the results shown in FIG. 13, and the following equation must be satisfied:

$VDD > Vds1 + 1V$

By applying a high level Vih1 of the data input 501 or 502 to the voltage setting terminal 105 of the reference voltage generating circuit 119, the same effect as that obtained by the logic circuit of FIGS. 1 and 5 can be obtained. Thus, it is possible to reduce Vds1, ideally down to several dozens of millivolts, as in FIGS. 1 and 5. Namely, the limit of the reduction of VDD is:

$$VDD > 1V + \text{ Several dozens of mV}$$
$$> 1.1V$$

Figure 6:
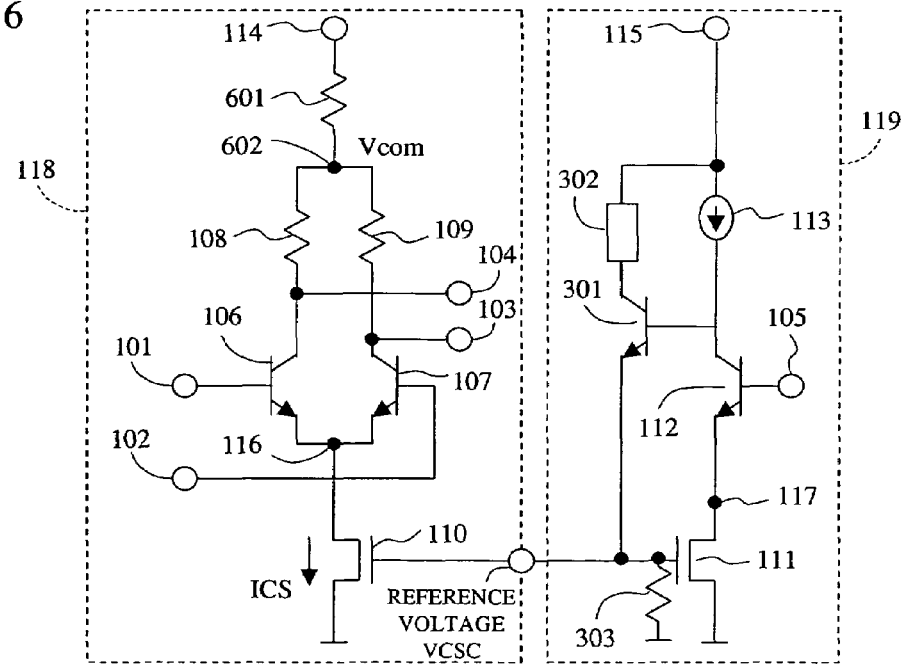
FIG. 6 shows a circuit diagram of a logic circuit according to a sixth embodiment of the invention, illustrating an example of the logic circuit of a flip-flop circuit.

FIG. 6 shows an example of the configuration of the logic circuit according to a sixth embodiment of the invention. The logic circuit of the present embodiment includes a series connection of a level-shifting resistor means 601 for shifting the output level, load resistors 108 and 109 for obtaining output, bipolar transistors 106 and 107 forming current switches, and a constant current-supplying n-type MOS transistor 110. The gate terminal of the MOS transistor 111 in the logic circuit, which includes the flip-flop circuit shown in FIG. 5, is connected to the gate terminal of the aforementioned MOS transistor 110. Namely, the reference voltage generating circuit 119 can be commonly used in the flip-flop circuit 118 shown in FIG. 5 and in the logic circuit 118' shown in FIG. 6. Further, first and second output terminals 103 and 104 are connected to the clock terminals 518 and 519 of the flip-flop circuit, respectively.

Figure 14:
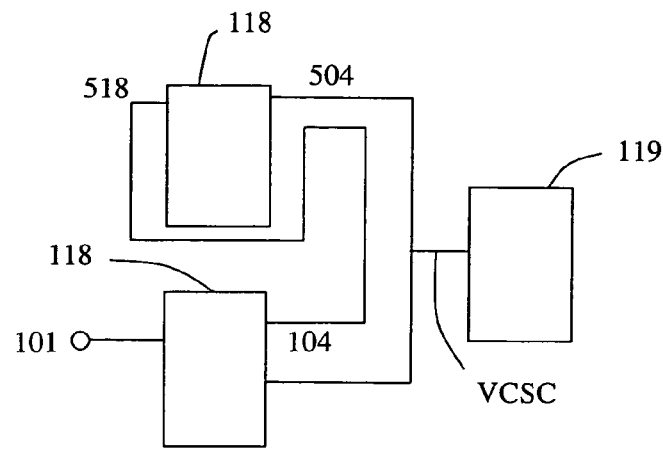
FIG. 14 schematically shows an example of a logic circuit in which the flip-flop circuit shown in FIG. 5 and the logic circuit shown in FIG. 6 are employed.

In the circuit with such a configuration, by applying to the voltage setting terminal 105 of the reference voltage generating circuit 119 the high-level voltage that is applied to the input 101 or 102, the power supply voltage VDD can be lowered because the current in the n-type MOS transistor 110 is not dependent on the power supply voltage VDD of the power supply 114, as in the circuit shown in FIG. 1. The high level for the input and that for the output are set to have the same value. Therefore, the input high level is the potential Vcom at the high-level shifting terminal 602. Accordingly, by using the logic circuit shown in FIG. 6 in combination with the flip-flop circuit shown in FIG. 5, for example, logic circuit voltage can be reduced as compared with the conventional logic circuits that employ BiCMOS. FIG. 14 schematically shows the configuration of a logic circuit in which the flip-flop circuit 118 of FIG. 5 is combined with the logic circuit 118' of the flip-flop shown in FIG. 6 and the reference voltage generating circuit 119 is commonly used.

This logic circuit will be described with reference to FIGS. 14, 5, and 6. Data capture and retention can be selected depending on whether the clock signals that are fed to the clock terminals 518 and 519 shown in FIG. 5 are high- or low-level. By setting the high-level voltage value higher, data rejection can be ensured. Thus, in order to raise the high level of the clock signal, the output of the logic circuit 118' shown in FIG. 6 is connected to the clock terminals 518 and 519. Specifically, in the logic circuit of FIG. 6, a high-level voltage that is lower than the power supply voltage by 0.2 to 0.3 V can be outputted to the clock terminal 518 of the flip-flop circuit 118 by shifting the output level determined by the resistor means 601. Since the reference voltage generating circuit 119 can be commonly employed for the flip-flop circuit 118 and the logic circuit 118', an increase in circuit size can be prevented.

While in the above description of the present embodiment the circuit of FIG. 6 has been described in connection with a flip-flop circuit, the circuit of FIG. 6 can be used in the circuit shown in FIG. 1 as a fundamental circuit capable of shifting the level of the output voltage. Thus, the circuit of FIG. 6 may be regarded as one of the fundamental circuits in the present specification.

Figure 7:
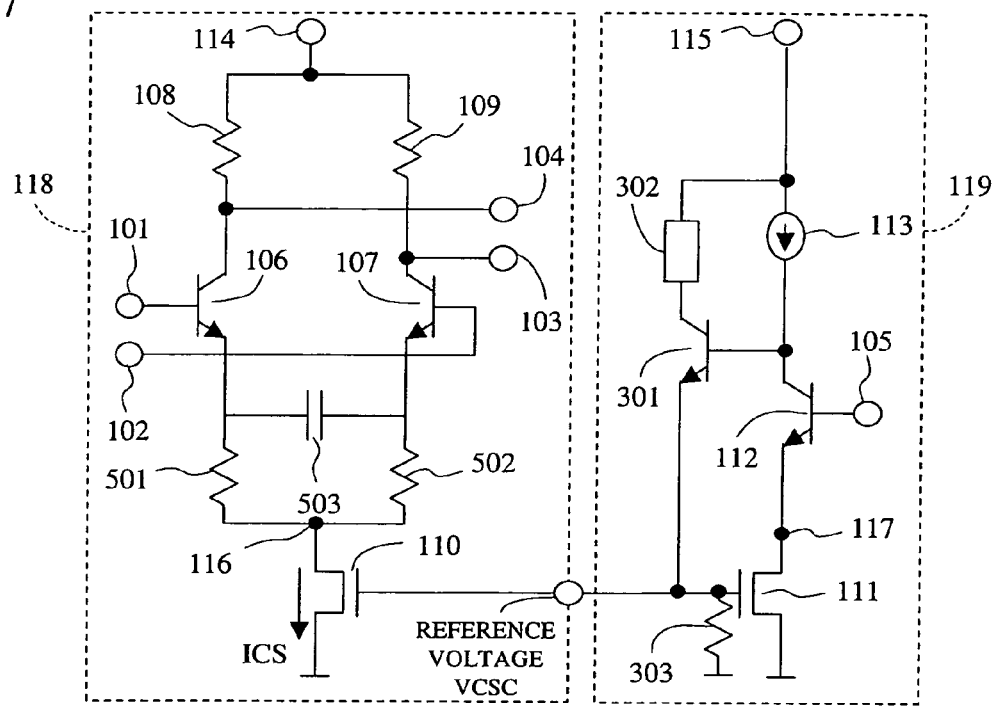
FIG. 7 shows a circuit diagram of a logic circuit according to a seventh embodiment of the invention, illustrating an example of an input circuit in which the gain in a high-frequency band is increased.

FIG. 7 shows an input circuit according to a seventh embodiment of the invention, in which the gain in a high-frequency band is increased. As shown in FIG. 7, the input circuit of this embodiment includes an emitter-coupled logic circuit 118 and a reference voltage supplying circuit 119. The emitter-coupled logic circuit 118 is made up of a current switch comprising a pair of bipolar transistors 106 and 107, a high-frequency band high-gain circuit comprising resistor means 501 and 502 and capacitor means 503, a circuit constant current-supplying n-type MOS transistor 110, and resistor means 108 and 109 for obtaining an output voltage.

The reference voltage generating circuit 119 in the present embodiment includes a constant current-supplying n-type MOS transistor 111, a bipolar transistor 112 and resistor means 704 for biasing the drain voltage of the n-type MOS transistor 111, and a control circuit 120 for controlling the drain current of the n-type MOS transistor 111. For example, when the input 101 is at a high level (=VDD) and the input 102 is at a low level (=VDD−Va), the emitter potential of the bipolar transistor 106 is lower than the potential at the input 101 by 0.8 V.

Further, as the bipolar transistor 106 is turned on, the current that flows in the n-type MOS transistor 110 flows via the power supply 114, resistor means 108, bipolar transistor 106, and resistor means 501. Thus, the drain voltage of the n-type MOS transistor 110 is VDD−0.8 V−Vd, Vd being the voltage drop due to the current ICS and the resistor-means 501. On the other hand, with regard to the drain voltage of the n-type MOS transistor 111 in the reference voltage generating circuit 119, by setting the voltage at the voltage setting terminal 105 to be equal to the aforementioned input 101 (=VDD), and by setting the resistor means 302, 501, and 502 to have the same resistance value, the same voltage can be dropped across the resistor means 302 and 501. In this way, the drain voltage of the n-type MOS transistor 110 can be made equal to that of the n-type MOS transistor 111. As a result, the current in the n-type MOS transistors 110 and 111 does not depend on the power supply voltage VDD of the power supply 114, as in the embodiment shown in FIG. 1, so that the power supply voltage VDD can be lowered. The gain of this circuit is determined by the ratio of the circuit impedance connected to the emitter of the bipolar transistor 106 to the load resistor 108. The circuit impedance consists of a parallel impedance of the resistor means 501 and the capacitance 503. At a high-frequency band, the impedance of the capacitance 503 decreases, and, therefore, the parallel impedance also decreases. Thus, the ratio of the impedance to the load resistor 108 increases at a high-frequency band, so that the gain can be increased in such high-frequency band. In this circuit too, the operation voltage can be lowered as in the above-described circuit.

Figure 8:
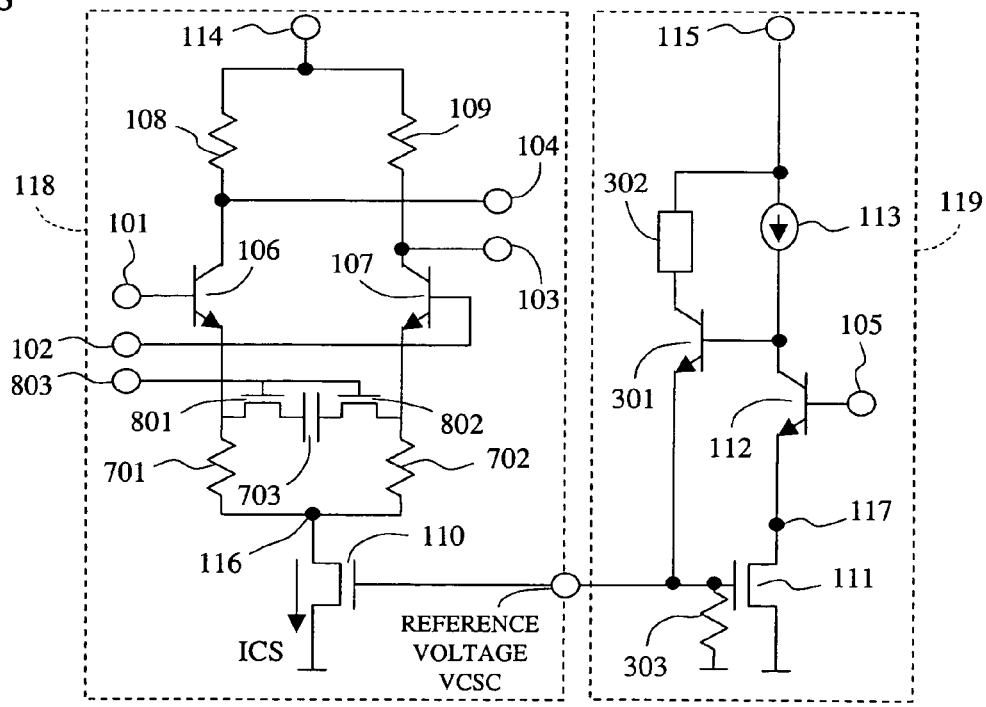
FIG. 8 shows a circuit diagram of a logic circuit according to a seventh embodiment of the invention, illustrating another example of an input circuit in which the gain in a high-frequency band is increased.

FIG. 8 shows a logic circuit according to an eighth embodiment of the invention, which is another example of the input circuit in which the gain in a high-frequency band is increased. As shown in FIG. 8, in the logic circuit of the present embodiment, by on/off controlling the input terminal 803 commonly connected to each control terminal (gate) of the n-type MOS transistors 801 and 802 that are connected in series at one of the current terminals (source or drain) via a capacitor 703, the connection between the emitter of the bipolar transistors 106 and 107, which are connected to the other current terminal (source or drain) of the n-type MOS transistors 801 and 802, and the capacitor 703 can be electrically controlled. When a high level voltage, namely VDD, is applied to the input terminal 803, both the n-type MOS transistors 801 and 802 are turned on and conducting, so that a substantially identical circuit to that shown in FIG. 7 is created where an increased gain can be obtained in a high-frequency band.

On the other hand, by applying a low level voltage, namely the ground potential, to the input 803, the n-type MOS transistors 801 and 802 are turned off, so that the effect of an increased gain in a high-frequency band cannot be obtained. However, regardless of the level at the input 803, the advantage can be obtained that, since the current in the n-type MOS transistors 110 and 111 do not depend on the power supply voltage VDD of the power supply 114, the power supply voltage VDD can be lowered.

Figure 9:
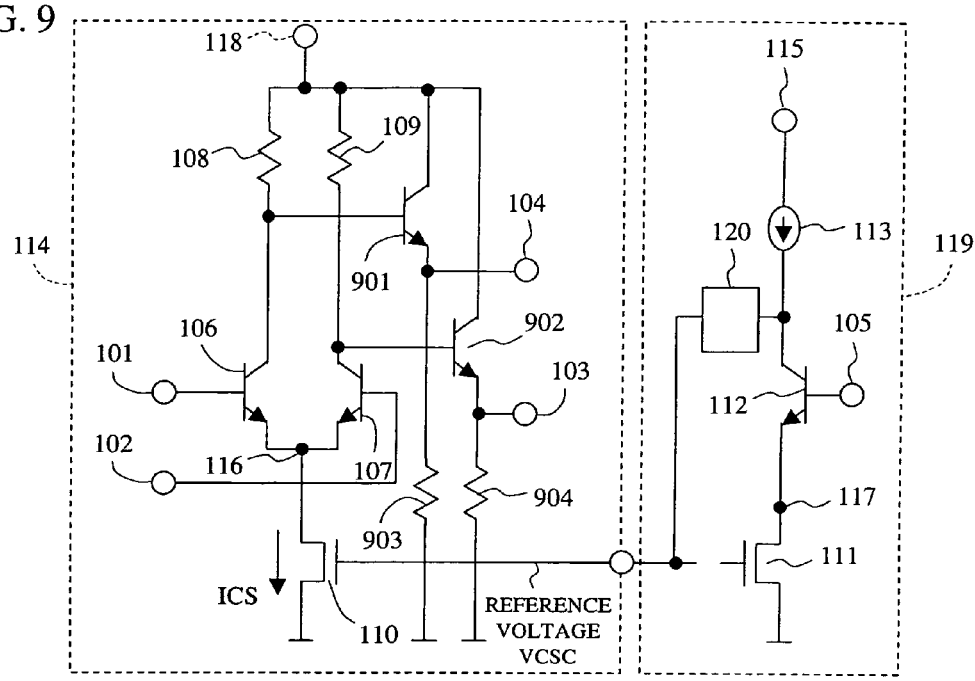
FIG. 9 shows a circuit diagram of a logic circuit according to a ninth embodiment of the invention, illustrating an example of an emitter-follower output circuit of a BiCMOS circuit.

FIG. 9 shows an example of the configuration of a BiCMOS logic circuit according to a ninth embodiment of the invention. As shown, the configuration of the logic circuit of the present embodiment is basically identical to that of the logic circuit of FIG. 1. The former differs in that there is provided an emitter-follower circuit consisting of bipolar transistors 901 and 902 and resistor means 903 and 904 in the output stage. The potentials at the outputs 104 and 103 are shifted by approximately 0.8 V by the emitter-follower circuit. Thus, the current in the n-type MOS transistors 110 and 111 are not dependent on the power supply voltage VDD of the power supply 114, which is basically the same as in FIG. 1, so that the power supply voltage VDD can be lowered.

Figure 10:
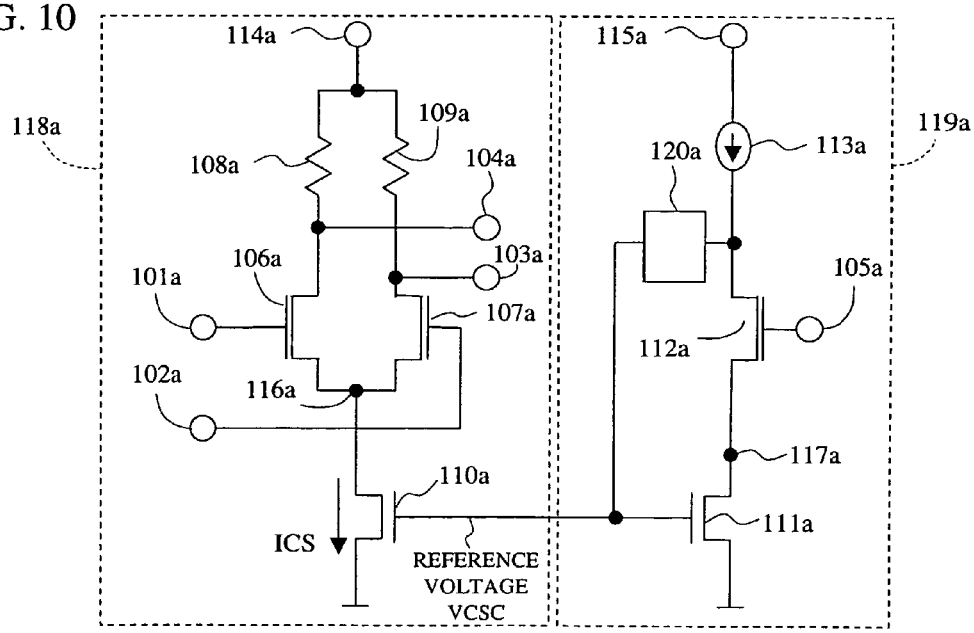
FIG. 10 shows a logic circuit according to a tenth embodiment of the invention, illustrating an example of a MOS logic circuit employing a MOS transistor in a current switch.

With reference to FIG. 10, a logic circuit according to a tenth embodiment of the invention will be described. The logic circuit of the present embodiment is basically the same as the logic circuit shown in FIG. 1. It is, however, characterized in that the current switch is made up of MOS transistors 106a and 107a instead of bipolar transistors, and that a bipolar transistor of the circuit shown in FIG. 1 is also replaced by a MOS transistor 112a. As the logic circuit of this embodiment is substantially identical to the circuit of FIG. 1 except in that the transistors are MOS transistors, elements corresponding to those designated by the numerals shown in FIG. 1 are designated by the same numerals with "a" added in FIG. 10 for ease of understanding.

In the circuit shown in FIG. 10, since the current switch is made up of the MOS transistors, advantages that a single circuit can be constructed using the same type of transistors (MOS transistors) and that the operation voltage can be lowered can be obtained.

Figure 11:
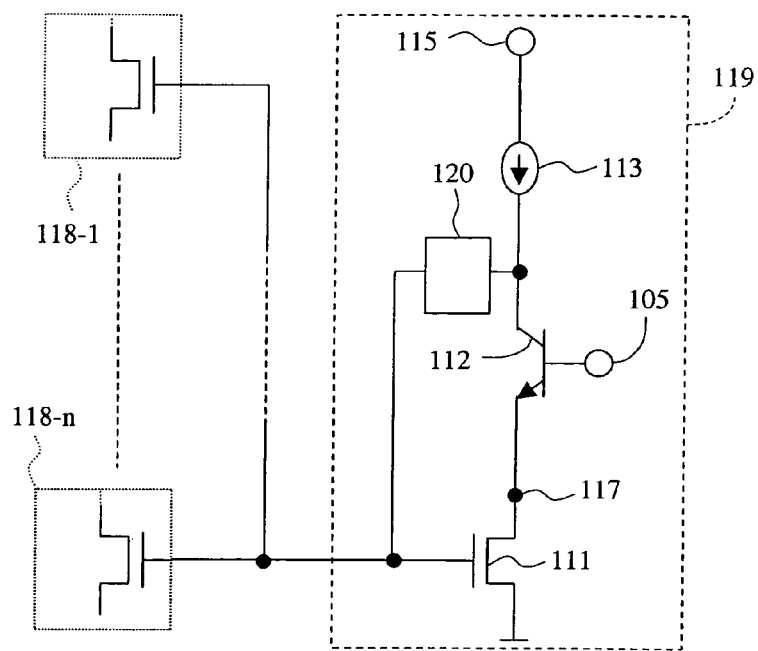
FIG. 11 shows a circuit diagram of a logic circuit according to an eleventh embodiment of the invention, in which a plurality of current switched are connected to a single reference-voltage generating circuit.
Figure 12:
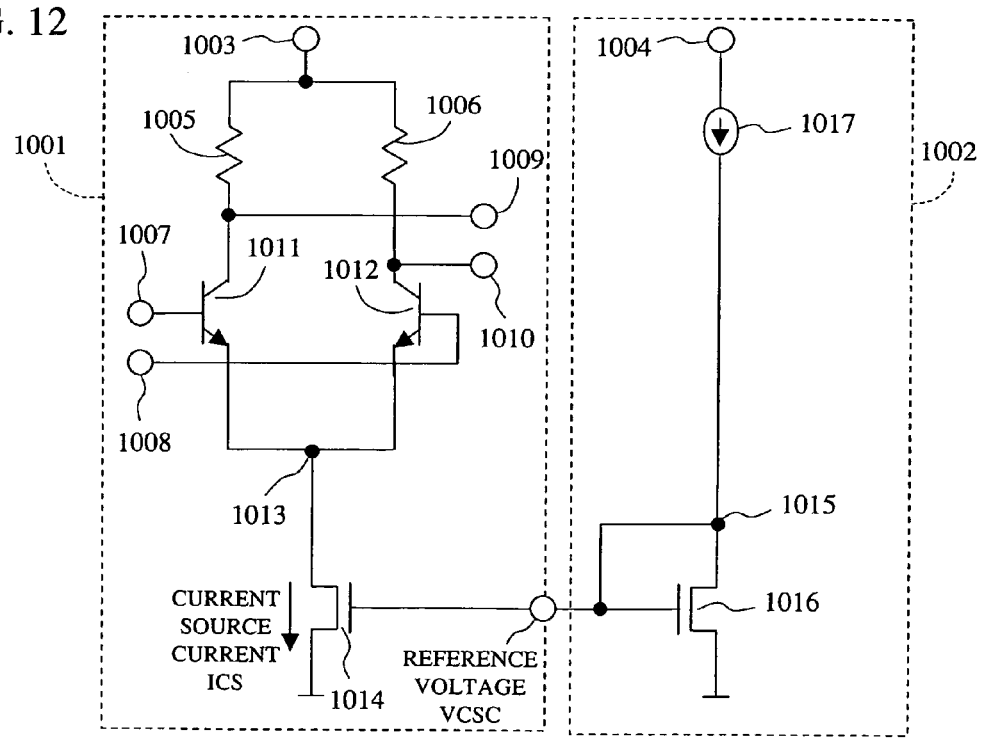
FIG. 12 shows an example of a conventional BiNMOS logic circuit.

With reference to FIG. 11, a logic circuit according to an eleventh embodiment of the invention will be described. This logic circuit is basically identical to the logic circuit of FIG. 1 except that a plurality (n) of current switches are connected to a single reference voltage generating circuit 119. As shown in FIG. 11, because the reference voltage generating circuit is connected to a plurality of current switches in the present embodiment, the number of the reference voltage generating circuits can be reduced as compared with the case where the current switches and the reference voltage generating circuits are connected on a one-to-one basis. As a result, the size of the circuit can be reduced. While the embodiment shown in FIG. 11 has been described with reference to the circuit of FIG. 1 as an example, the same configuration can be equally adapted to any of the circuits or their variations shown in FIGS. 2 to 10.

While the present invention has been described with reference to the preferred embodiments, it should be apparent that the invention is not limited to those embodiments.

The present invention can be adapted for the low-voltage operation of high-speed and high packaging-density ICs. The invention can be applied to both digital and analog circuits, and it may be preferably applied to OEICs in which ICs are integrated with optical devices.

What is claimed is:

1. A logic circuit comprising:
    a logic circuit portion including at least one current switch comprising a pair of a first transistor and a second transistor, and a first constant current source comprising a first MOS transistor of a first conduction type that is connected to each current switch in series, said logic circuit portion being operated at a first power supply voltage; and
    a reference voltage generating circuit including a second MOS transistor of a first conduction type that is operated by a control voltage which is applied to a common gate wire to which the gates of said first and second MOS transistors are commonly connected, a second constant current source connected in series with said second MOS transistor, and a control voltage adjusting means for adjusting said control voltage in a direction such that the drain current flowing in said second MOS transistor is substantially in the same direction as a constant current that flows in said second constant current source.

2. The logic circuit according to claim 1, further comprising a level-shifting resistor means provided between each of said current switches and a first power supply.

3. The logic circuit according to claim 1, wherein said reference voltage generating circuit comprises:
    a third transistor connected in series between said second MOS transistor and said second constant current source, said third transistor having the same electric characteristics as those of either said first or said second transistor, and having a control terminal to which substantially the same voltage as a high-level voltage that is applied to a control terminal of the other transistor is applied; and
    a first control circuit provided between a control terminal of said second MOS transistor and a current terminal of said third transistor that is located towards said second constant current source, wherein the voltage at said common gate wire is controlled by causing a current to flow from the said second constant current source to said second MOS transistor via said third transistor.

4. The logic circuit according to claim 3, wherein said second constant current source comprises:
    a current mirror circuit including a pair of a third and a fourth MOS transistor of a second conduction type which is different from said first conduction type, wherein said third and fourth MOS transistors have their sources or drains commonly connected to a second power supply with a different power supply voltage from said first power supply voltage, with their gates commonly connected, wherein said third MOS transistor is connected, via its drain or source terminal, to said third transistor in series, and said gate terminal is connected to the source terminal of said fourth MOS transistor; and
    a third constant current source connected in series with said fourth MOS transistor via its drain or source.

5. The logic circuit according to claim 4, wherein said first control circuit has one of its current terminals connected to said second power supply, its control terminal connected to a current terminal of said third transistor that is located towards said second constant current source, and the other current terminal connected to said common gate wire.

6. The logic circuit according to claim 5, wherein said fourth transistor is a bipolar transistor, and said reference voltage generating circuit comprises a first resistor means that forms a voltage divider which branches off from said common gate wire, from which said control circuit also branches off.

7. The logic circuit according to claim 5, wherein said fourth transistor is a MOS transistor.

8. The logic circuit according to claim 1, further comprising:
    a second and a third resistor means connected in series between each of the pair of transistors forming said current switch and said first constant current source;
    wires connecting said pair of transistors to said second and third resistor means individually; and
    a capacitor disposed between said wires.

9. The logic circuit according to claim 8, further comprising a first and a second switch disposed between said wires and said capacitor, said first and second switches being adapted to be opened and closed based on a control signal.

10. A logic circuit comprising:
a flip-flop circuit including a first current switch comprising a first transistor pair, a second current switch comprising a second transistor pair, a first and a second constant current source comprising a first and a second MOS transistor of a first conduction type that are connected in series with said first and second current switches, respectively, a first and a second clock terminal for applying a clock signal which are connected to a common node of said first and said second current switches, and a switch means for switching the operation of said first and said second current switches regarding data capturing and data storage, said flip-flop circuit being operated by a first power supply; and
a reference voltage generating circuit including a third MOS transistor of a first conduction type that is operated by a control voltage applied to a common gate wire commonly connected to said first and second MOS transistors, a second constant current source connected in series with said third MOS transistor, and a control voltage adjusting means for adjusting said control voltage such that the current that flows in said third MOS transistor flows in substantially the same direction as a constant current flowing in said third constant current source.

11. A logic circuit comprising:
a flip-flop circuit including a first constant current source comprising a first MOS transistor of a first conduction type; and
a reference voltage generating circuit including a second MOS transistor of the first conduction type that is operated by a control voltage applied to a common gate wire commonly connected to said first MOS transistor, a second constant current source connected in series with said second MOS transistor, and a control voltage adjusting means for adjusting said control voltage such that a drain current that flows in said second MOS transistor flows in substantially the same direction as a constant current flowing in said second constant current source.

12. A logic circuit comprising:
a logic circuit portion comprising at least one current switch including a pair of a first and a second transistor, and a constant current source including a first MOS transistor of a first conduction type that is connected in series with said current switch; and
a reference voltage generating circuit portion adapted to be operated by a second power supply voltage, said reference voltage generating circuit comprising a second MOS transistor of the first conduction type, a reference current source, a first control means for performing a control such that a reference current that flows in said reference current source becomes substantially equal to a drain current in said second MOS transistor, a second control means for performing a control such that the source-drain voltages of said first MOS transistor and said second MOS transistor become substantially equal, and a third control means for feedback-controlling a reference voltage applied to the gate terminal of said first and second MOS transistors in response to a fluctuation of said source-drain voltage due to a fluctuation of the power supply voltage in said first circuit.

13. The logic circuit according to claim 12, wherein
said current switch comprises a first and a second transistor of which first current terminals for receiving a carrier are mutually connected and of which second current terminals for injecting a carrier are mutually connected and are also connected to said constant current source,
said first control means comprises a current mirror including a third and a fourth transistor of a second conduction type which is different from said first conduction type, wherein control terminals of said first and second transistors are mutually connected, and first current terminals of said third and fourth transistors for receiving a carrier are connected to a power supply voltage terminal for supplying said second power supply voltage and are connected to each other, wherein second current terminals of said third and fourth transistors for injecting a carrier are connected to one end of said reference current supply and to the drain of said second MOS transistor;
said second control means comprises a dummy circuit configuration including said second MOS transistor, a fifth transistor, and a common connection wire connecting said second MOS transistor and said fifth transistor, wherein said fifth transistor is a replica transistor of said first or second transistor to the gate terminal of which a voltage substantially equal to a control voltage corresponding to a high level applied to the gate terminal of either said first or said second MOS transistor is applied, the two current terminals of said fifth transistor being connected to said fourth transistor and to said second MOS transistor, respectively; and
said third control means comprises a feedback circuit including said fourth transistor and a sixth transistor of a first conduction type, said sixth transistor having a control terminal connected to one of the current terminals of said fifth transistor which is connected to said fourth transistor, wherein said sixth transistor is connected to said power supply voltage terminal and to said common connection wire.

* * * * *